US009496073B2

(12) United States Patent
Shen

(10) Patent No.: US 9,496,073 B2
(45) Date of Patent: Nov. 15, 2016

(54) METHOD AND SYSTEM FOR CONTROLLING CHEMICAL REACTIONS BETWEEN SUPERCONDUCTORS AND METALS IN SUPERCONDUCTING CABLES

(71) Applicant: Tengming Shen, Naperville, IL (US)

(72) Inventor: Tengming Shen, Naperville, IL (US)

(73) Assignee: Fermi Research Alliance, LLC, Batavia, IL (US)

( * ) Notice: Subject to any disclaimer, the term of this patent is extended or adjusted under 35 U.S.C. 154(b) by 672 days.

(21) Appl. No.: 13/855,190

(22) Filed: Apr. 2, 2013

(65) Prior Publication Data

US 2014/0296077 A1    Oct. 2, 2014

(51) Int. Cl.
| | |
|---|---|
| *H01L 39/24* | (2006.01) |
| *H01B 12/08* | (2006.01) |
| *H01L 39/14* | (2006.01) |
| *H01B 12/02* | (2006.01) |
| *H01B 12/10* | (2006.01) |

(52) U.S. Cl.
CPC ............. *H01B 12/08* (2013.01); *H01L 39/143* (2013.01); *H01L 39/248* (2013.01); *H01B 12/02* (2013.01); *H01B 12/10* (2013.01); *Y02E 40/641* (2013.01); *Y10T 29/49014* (2015.01)

(58) Field of Classification Search
CPC ...... H01B 12/02; H01B 12/08; H01B 12/10; H01L 39/248
USPC ........................................................ 505/231
See application file for complete search history.

(56) References Cited

U.S. PATENT DOCUMENTS

| | | | |
|---|---|---|---|
| 4,079,187 A | | 3/1978 | Fillunger et al. |
| 4,169,964 A | | 10/1979 | Horvath et al. |
| 4,327,244 A | | 4/1982 | Horvath et al. |
| 4,336,420 A | | 6/1982 | Benz |
| 5,319,843 A | | 6/1994 | Primdahl Iverson et al. |
| 5,340,799 A | | 8/1994 | Tauber et al. |
| 6,344,287 B1 | * | 2/2002 | Celik et al. .................. 428/697 |
| 6,418,331 B1 | | 7/2002 | Goldacker |
| 6,448,501 B1 | | 9/2002 | McIntyre et al. |
| 6,591,120 B1 | * | 7/2003 | Tanaka et al. ................ 505/231 |
| 2003/0138648 A1 | * | 7/2003 | Bianco et al. ................ 428/469 |
| 2009/0191405 A1 | * | 7/2009 | Kim et al. .................... 428/336 |

* cited by examiner

*Primary Examiner* — Paul Wartalowicz
(74) *Attorney, Agent, or Firm* — Kevin Soules; Kermit D. Lopez; Luis M. Ortiz

(57) ABSTRACT

A method, system, and apparatus for fabricating a high-strength Superconducting cable comprises pre-oxidizing at least one high-strength alloy wire, coating at least one Superconducting wire with a protective layer, and winding the high-strength alloy wire and the Superconducting wire to form a high-strength Superconducting cable.

7 Claims, 5 Drawing Sheets

US 9,496,073 B2

METHOD AND SYSTEM FOR CONTROLLING CHEMICAL REACTIONS BETWEEN SUPERCONDUCTORS AND METALS IN SUPERCONDUCTING CABLES

STATEMENT OF GOVERNMENT RIGHTS

The invention disclosed in this application was made with Government support under the Fermi Research Alliance, LLC, contract Number DE-AC02-07CH11359 awarded by the U.S. Department of Energy. The Government has certain rights in the invention.

TECHNICAL FIELD

Embodiments are generally related to the field of Superconductors, Superconducting magnets, and Superconducting cables. Embodiments are also related to methods and systems for fabricating high-strength, large-current wires and cables.

BACKGROUND OF THE INVENTION

Long-length Superconductors that can carry high current density in strong magnetic fields are very valuable. The magnetic pressure that results from flowing current in Superconductors in strong magnetic fields can create extreme electromagnetic stresses on the Superconducting material, with the magnetic pressure being proportional to the square of the magnetic field strength. Such pressure may be strong enough to cause inelastic deformation in the Superconducting material. High-temperature Superconducting compounds are often brittle and will rupture if subjected to more than minimal deformation. This creates a practical limit in maximizing the strength of the induced magnets. A need therefore exists for methods and systems to provide mechanical reinforcement in Superconducting cables while avoiding harmful chemical reactions between the reinforcing material and the Superconducting material.

SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide a method and system for a high-strength Superconducting cables.

It is another aspect of the disclosed embodiments to provide for an enhanced method and system for fabricating high-strength Superconducting cables.

It is yet another aspect of the disclosed embodiments to provide an enhanced method, system, and apparatus for high-strength, high critical current Superconducting cables by incorporating high-strength, high-temperature alloy in a cable pack while controlling harmful chemical reactions between the high-strength alloy and Superconducting wires.

The aforementioned aspects and other objectives and advantages can now be achieved as described herein. A method for fabricating a high-strength Superconducting cable comprises forming at least two protective layers around at least one high-strength alloy wire and coating at least one Superconducting wire with a protective layer. The method includes arranging the high-strength alloy wire and the at least one Superconducting wire to form the high-strength Superconducting cable and treating the Superconducting cable with a heat treatment cycle.

Other forms in which embodiments of the invention can be manifest, and additional embodiments of the invention are described in the remainder of the description and claims provided.

BRIEF DESCRIPTION OF THE FIGURES

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

Figure 1:
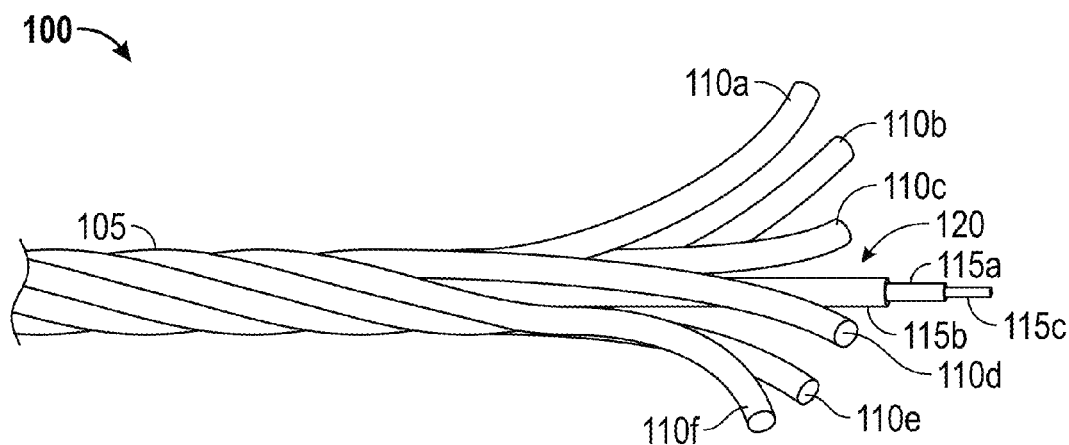
FIG. 1 depicts a side view of a high-strength Superconducting cable.

The embodiments of the invention described herein serve to improve stress tolerance of Superconducting multi-strand cables made from cuprate Superconducting composite conductors by incorporating high-strength material into a cable pack while maintaining high Superconducting performance by minimizing poisoning reactions between the reinforcing material and Superconductor composite. FIG. 1 illustrates a 6-around-1 cable configuration. However, the methods and systems described are not limited to the 6-around-1 structure and can advantageously be embodied as a number of different configurations as described herein, including any of the embodiments illustrated in FIGS. 3a-3e. The particular values and configurations discussed in these non-limiting examples can be varied and are cited merely to illustrate at least one embodiment and are not intended to limit the scope thereof.

Figure 2:
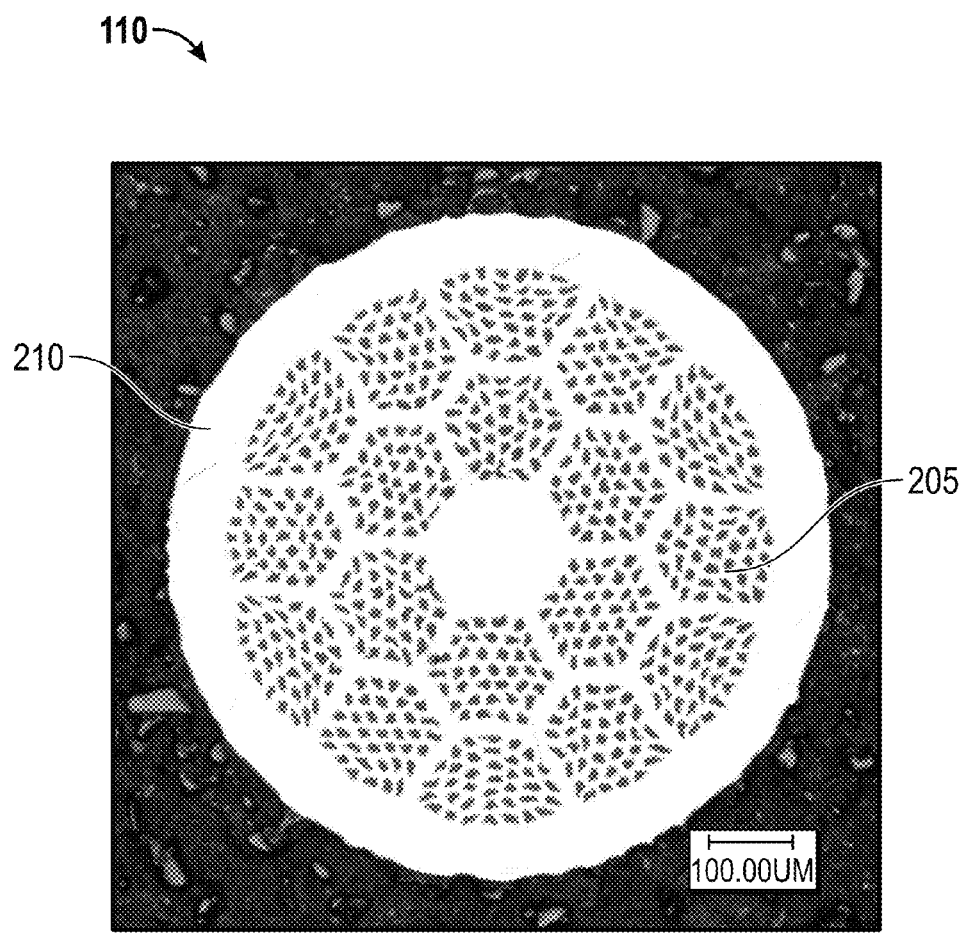
FIG. 2 depicts a cross section of Ag-alloy sheathed multifilament Bi-2212 round wire.

FIG. 1 illustrates a side view of a high-strength Superconducting cable 100 in accordance with an embodiment of the invention. The Superconducting wires 110a-f comprises Bi-2212 round wire, which is a multifilament wire that contains hundreds of filaments of $Bi_2Sr_2CaCu_2O_x$ as shown in FIG. 2 at 205, embedded in a pure Ag matrix 210. The Ag and filaments can be again encased in a stronger Ag alloy, such as precipitation hardening AgMg alloy with MgO particles precipitations after being heat treated in an oxygen environment.

In an embodiment of the present invention, at least two protective oxide layers 115a and 115b insulate the conductors of the coil windings of Superconducting cable 105 and eliminate the chemical interactions between the Superconducting wires 110a-f and high-strength alloy wire 120 that might otherwise degrade the Superconducting and mechanical properties of the Superconducting coil windings.

Figure 1A:
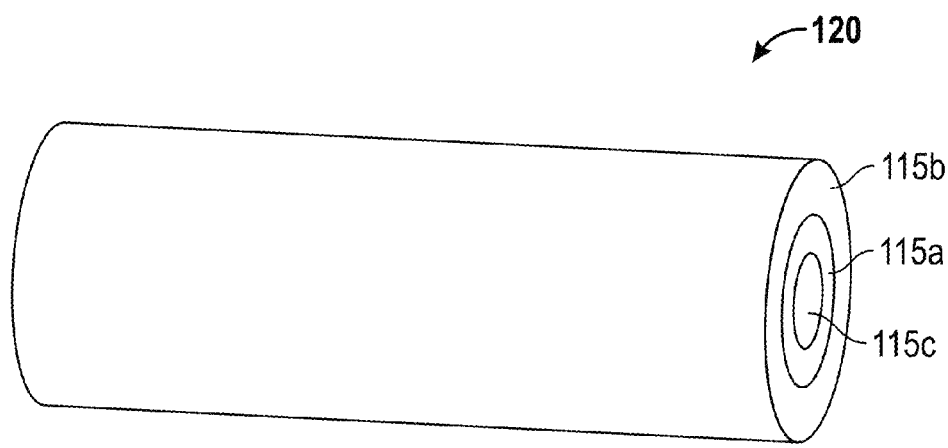
FIG. 1A depicts a side view of a high-strength alloy wire.

FIG. 1A illustrates protective insulating covers 115a and 115b provided around Alloy wire 115c to form high-strength alloy wire 120. Alloy wire 115c can be annealed in $O_2$ using standard melt processing techniques. Oxidizing alloy wire 115c provides a passivation oxide layer 115a on the alloy wire's surface. Additionally a second non-reactive oxide layer 115b is applied by solution based approaches such as sol-gel methods so that its thickness and uniformity can be controlled. This allows high critical current density in the Superconducting windings while protecting against the large electromagnetic forces in the high-field Superconducting windings.

It is critical that the material selected for high-strength alloy wire 120 maintain good mechanical properties after a heat treatment and that the high-strength alloy wire 120 be chemically compatible with Bi 2212, or other such wire, so that the conductivity of Superconducting wires 110a-110f can be maintained.

Figure 1B:
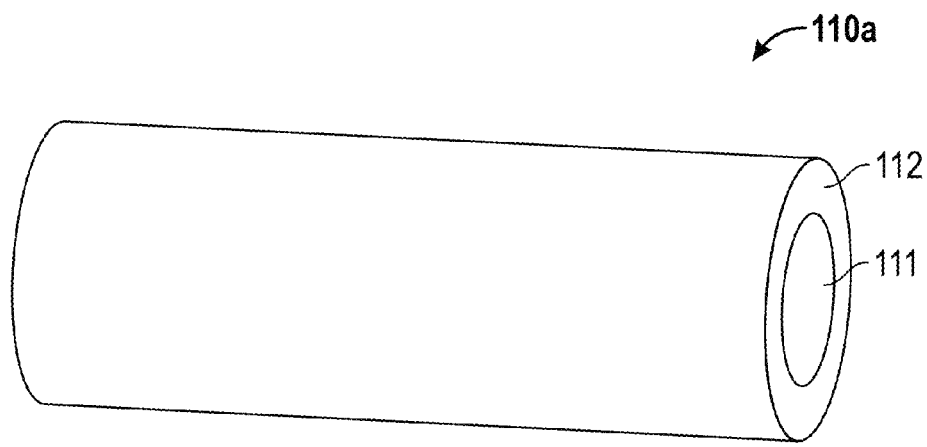
FIG. 1B depicts a side view of a Superconducting wire.

High-strength cable 100 is further comprised of a set of Superconducting round wires 110a-110f. In another embodiment, wires 110a-110f can be coated with an oxide layer. FIG. 1B illustrates a side view of Superconducting round wire 110a. It should be appreciated that Superconducting round wire 110b-f can be similarly formed. In FIG. 1B, Superconductor 111, which is Bi-2212 round wire, or other such superconducting wire, is covered with protective oxide layer 112.

A high-strength Superconducting cable 105 can be formed by winding Superconducting wires 110a-f around a high-strength alloy wire 120. The completed cable package is shown at reference numeral 105. Fabrication of Bi-2212 Superconducting magnets may employ a "wind and react" approach because Bi-2212 becomes brittle after reaction.

Figure 4:
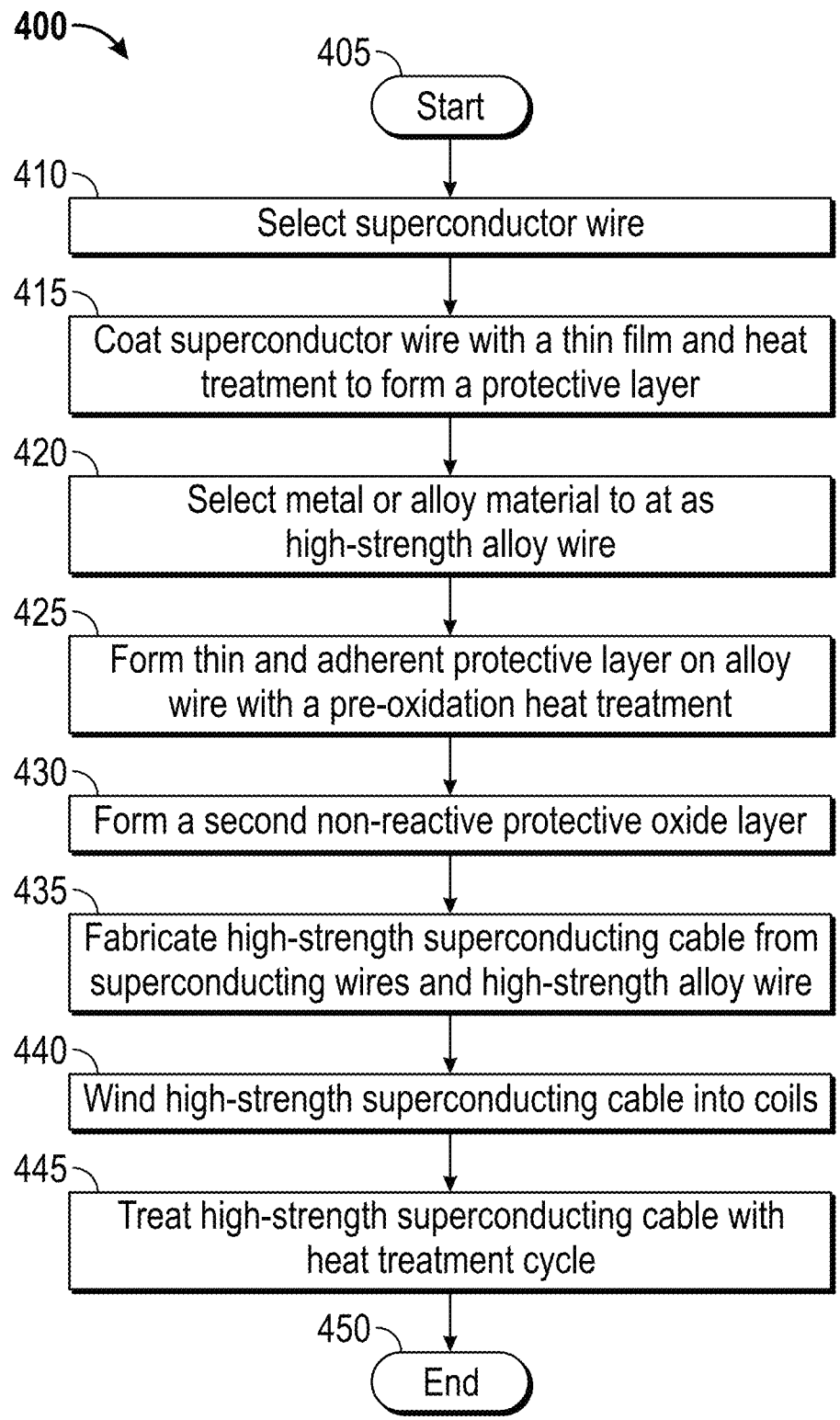
FIG. 4 depicts a series of steps for fabricating a high-strength Superconducting cable.

The high-strength Superconducting cable 105, can be fabricated according to the method illustrated in FIG. 4. It is capable of use in very high field magnetic applications, including applications that are subject to high-temperature treatments. The high-strength Superconducting cable is strain-tolerant to extreme electromagnetic stresses that result from the strong currents associated with Superconductors in high magnetic fields. The coating layers such as layers 115a, 115b, and 112, reduce the chemical interactions between the high-strength alloys, and Superconducting wires.

In FIG. 1 a single high-strength alloy wire 120 is wound around 6 Superconducting wires 110a-110f. This configuration is called a 6-around-1, or 6+1 type cable. A set of alternative configurations are shown in FIGS. 3A-3E.

Figure 3A:
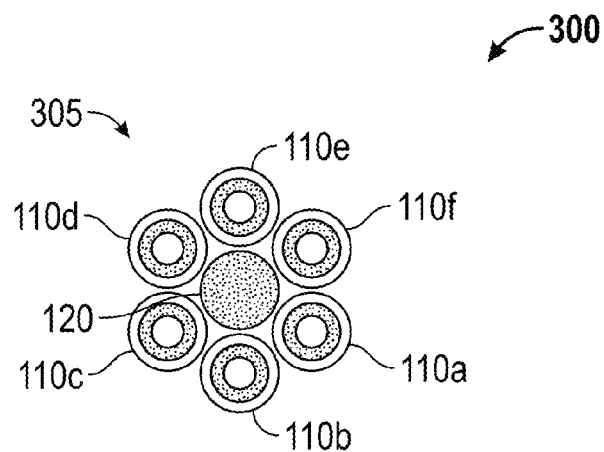
FIG. 3A depicts a 6+1 high-strength Superconducting cable.

FIGS. 3A-E show a set of configurations of Superconducting round wire 110 and high-strength alloy wire 120. FIG. 3A illustrates a 6+1 type cable wherein a single high-strength alloy wire 120 is wrapped by 6 Superconducting wires 110a-f.

Figure 3B:
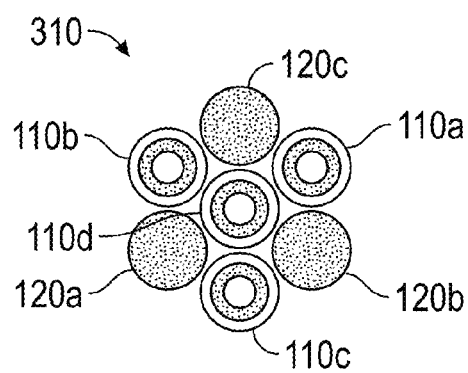
FIG. 3B depicts a 4+3 high-strength Superconducting cable.
Figure 3C:
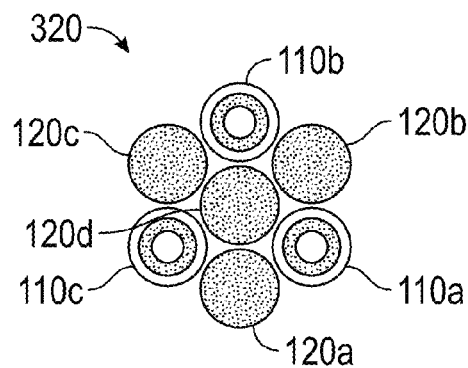
FIG. 3C depicts a 3+4 high-strength Superconducting cable.

FIG. 3B illustrates a 4+3 type cable with 4 Superconducting wires 110a-d wound with 3 high-strength alloy wires 120a-c. Finally FIG. 3C demonstrates a 3+4 type cable where 4 high-strength alloy wires 120a-d are wound with 3 Superconducting wires 110a-c.

Figure 3D:
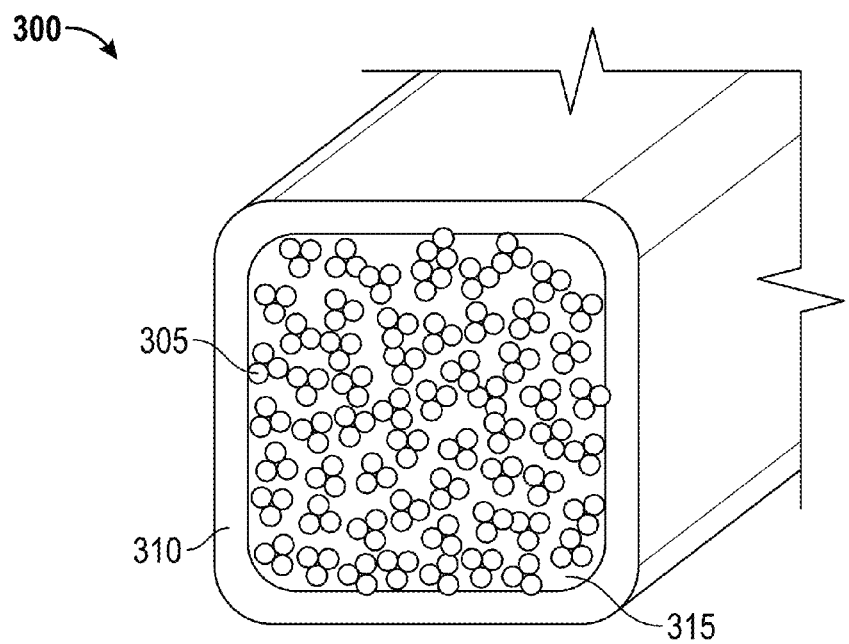
FIG. 3D depicts a cable-in-conduit cable.

FIG. 3D demonstrates a cable-in-conduit cable configuration 300 in accordance with an alternate embodiment of the invention. Cable-in-conduit configuration 300 includes hundreds of Superconducting wires 110 and high-strength alloy wires, twisted and transported on top of each other, illustrated as 305. They are encased in a high-strength conduit 310. Helium 315 flows inside conduit 310 to cool the Superconductors.

Figure 3E:
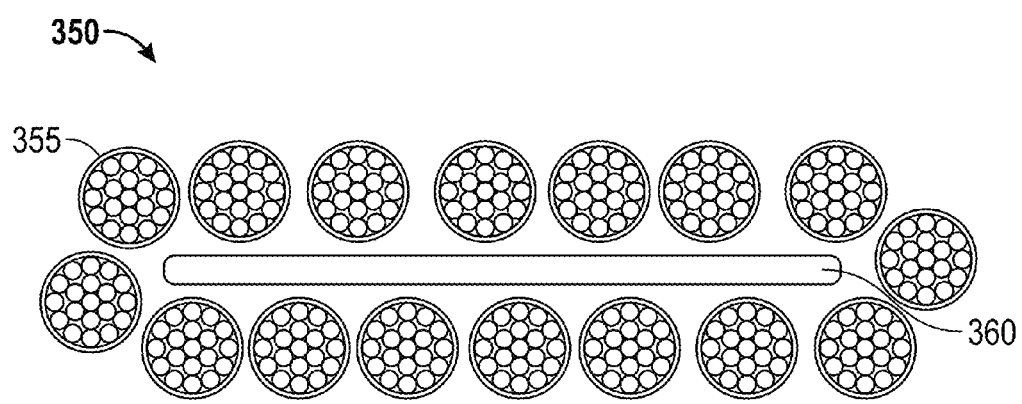
FIG. 3E depicts a Rutherford cable.

FIG. 3e illustrates a Rutherford cable configuration 350 in accordance with an alternative embodiment of the invention. Rutherford configuration 350 includes a set of high-strength Superconducting cables 155 and a core 160 inserted to reduce the eddy current between filaments.

It should be appreciated that in each configuration of FIG. 3a-3e the Superconducting wires and high-strength wires can be configured according to the materials and arrangements disclosed herein. Furthermore, it should be appreciated that FIGS. 3a-3e illustrate exemplary embodiments but other arrangements of Superconducting wires and high-strength wires could be successfully employed.

FIG. 4 illustrates high-level operational steps for fabricating a high-strength Superconducting cable. The method begins a block 405.

The next step is to select a Superconducting wire such as wire 110a-f as shown at block 410. As depicted next at block 415, the Superconducting wire can be coated with a thin film and heat treatment to from a protective layer on the Superconducting wire. A solution deposition method can be used to create a 10-20 μm thick protective ceramic layer formed of $TiO_2$ or $Al_2O_3$. In an example embodiment, the protective ceramic layer can be a thin uniform ceramic coating. This may alternatively include coating the wire using a reel-to-reel solution based method such as, for example, sol-gel. The heat treatment includes heating to a range of 300-400 degrees Celsius to reduce organic binder material.

The protective layer on the Superconducting wire electrically insulates the conductors of the coil windings from each other, and also eliminates the chemical reactions between the Superconducting wires and the high-strength alloy wire. Reducing the chemical reactions helps prevent current "leaking" that is caused by cracks in the Superconducting wire.

There are a number of oxides that are non-reactive when heat-treated while in contact with Ag-sheathed Bi-2212, including $TiO_2$, $Al_2O_3$, $CeO_2$, pure $SiO_2$, $Y_2O_3$, $ZrO_2$, $CaZrO_3$, and $SrZrO_3$. Thus, high-strength alloys with high fractions of these metal cations are selected so that during heat treatment in $O_2$, these oxides will form on the surface of the high-strength alloys instead of $Cr_2O_3$. The aluminum content in the selected alloy must be sufficiently high to develop and maintain an alumina layer and prevent subsequent breakaway oxidation. FeCrAl is the most compatible with Ag—Bi-2212 at high temperatures because its surface oxide is $Al_2O_3$, which forms because $Al_2O_3$ is more thermodynamically stable than either $Cr_2O_3$ or $Fe_2O_3$. However, any high-strength alloy that is compatible with Ag—Bi-2212 can be used such as alloys in the Inconel X-750 series.

Therefore, the next step 420 in creating a chemically compatible cable can be to select or create a suitable metal or alloy material for use as the high-strength wire, such as high-strength alloy wire 120. The next step 425 is to react the high-strength alloy in oxygen to form a thin and adherent passivation non-reactive protective layer of $Al_2O_3$ or other chemically compatible oxide on the material surface in a pre-oxidation heat treatment. The oxidizing heat treatment cycle depends on the properties of the selected materials. In this example, the material selected is FeCrAl and the oxidation heat treatment includes holding the oxygenated atmosphere at 900° C. for 5 hours, cooling to 835° C. at 2° C./hour, and then holding at 835° C. for 48 hours. The $Al_2O_3$ layer is highly stable, continuous, free from cracks or pores, adherent and coherent.

Following the example, FeCrAl has a young's modulus E of 124 GPa, and a yielding strength σy of 317 MPa. For higher strength materials such as Inconel X750 (E=1440 and σγ=191), and the like, higher fractions of Al or Ti are required so that the new alloys will demonstrate the same characteristics as FeCrAl but maintain a higher mechanical strength.

As indicated at block 430, a second thin adherent protective oxide layer can be formed on the high strength wire. This can be achieved using, for example, plasma spraying, an electron-beam, physical vapor deposition, or a solution based coating method such as sol-gel. The passivation oxide reduces the difficulty of forming additional layer of oxides if necessary. Continuing to follow the Example case, the $TiO_2$ was coated using a reel-to-reel solution based method.

Block 435 illustrates that the Superconducting wires and high-strength alloy wires are used to fabricate a cable. Winding the high-strength Superconducting cable comprises wrapping the at least one high-strength alloy wire and the at least one Superconducting wire into one of a 1+6 cable pack, a 4+3 cable pack, a 3+4 cable pack, a cable-in-conduit cable, or a Rutherford cable. This Superconducting cable is capable of handling the extremely high pressure that results from the magnetic pressure associated with flowing current in Superconductors that creates high electromagnetic stresses on the Superconducting material.

Once the cable is fabricated, at block 440 it can be wound into coils. The method next comprises treating the high-strength Superconducting cable with a heat treatment cycle as shown at block 445. The heat treatment cycle reaches a temperature of at least 890 degrees Celsius. The heat treatment schedule includes heating a 100% $O_2$ atmosphere containing the Superconducting cable from room temperature to 820° C. at 160° C./hour, holding at 820° C. for 2 hours, heating again from 820° C. to 891° C. at 48° C./hour, holding at 891° C. for 0.2 hours, cooling to 881° C. at 10° C./hour, further cooling to 835° C. at 2.5° C./hour, holding at 835° C. for 48 hours, and then quickly cooling to room temperature. The method then ends at block 450.

Based on the foregoing, it can be appreciated that a number of example embodiments, preferred and alternative, are disclosed herein. For example, in one embodiment, a method for fabricating a high-strength Superconducting cable comprises forming at least two protective layers around at least one high-strength alloy wire and coating at least one Superconducting wire with a protective layer. The method includes arranging the high-strength alloy wire and the at least one Superconducting wire to form the high-strength Superconducting cable and treating the Superconducting cable with a heat treatment cycle.

In another embodiment the method includes wherein the at least one Superconducting wire comprises Bi-2212 round wire and at least one high-strength alloy wire comprises at least one of FeCrAl FeCrAl, or an alloy selected from the Inconel X-750 series.

In another embodiment the method comprises forming at least two protective layers around at least one high strength alloy wire further comprising pre-oxidizing and heat treating the high-strength alloy wire to form a first protective oxide layer and coating the at least one high-strength alloy wire with 20 micrometer oxide to form a second protective oxide layer.

In another embodiment the high strength alloy wire is arranged with the at least one Superconducting wire to form the high-strength Superconducting cable further comprises wrapping the at least one high-strength alloy wire and the at least one Superconducting wire into one of a 1+6 cable pack, a 4+3 cable pack, a 3+4 cable pack, a cable-in-conduit cable, and a Rutherford cable.

In yet another embodiment the method further comprises winding the Superconducting cable into a coil. In an additional embodiment treating the high-strength Superconducting cable with a heat treatment cycle further comprises treating the high-strength Superconducting cable to the heat treatment cycle in 100% flowing $O_2$ wherein the heat treatment cycle reaches a temperature of at least 891 degrees Celsius.

In one example embodiment, a high-strength Superconducting cable comprises at least one high-strength alloy wire covered with at least two protective layers, at least one Superconducting wire coated with a protective layer wrapped together with the at least one high-strength alloy wire to form a high-strength Superconducting cable wherein the Superconducting cable is treated with a heat treatment cycle. In this example embodiment, the apparatus of the at least one Superconducting wire comprises Bi-2212 round wire.

In an alternative embodiment the at least one high-strength alloy wire comprises one of FeCrAl, or an alloy selected from the Inconel X-750 series. A first protective layer covering the at least one high-strength alloy wire comprises a protective oxide layer formed by pre-oxidizing and heat treating the high-strength alloy wire, and a second protective layer covering the at least one high-strength alloy wires comprises a 20 micrometer oxide coating.

In an additional embodiment, the high-strength Superconducting cable further comprises a 1+6 cable pack, a 4+3 cable pack, a 3+4 cable pack, a cable-in-conduit cable, and a Rutherford cable. In another embodiment the high-strength Superconducting cable is wound into a coil.

In yet another embodiment a heat treatment cycle is preformed in 100% flowing O2 and reaches a temperature of at least 891 degrees Celsius.

A system for conducting current comprises at least one high-strength alloy wire covered with at least two protective layers, at least one Superconducting wire coated with a protective layer wrapped together with the at least one high-strength alloy wire to form a high-strength Superconducting cable wherein the Superconducting cable is treated with a heat treatment cycle. The Superconducting wire comprises Bi-2212 round wire.

In an alternative embodiment the at least one high-strength alloy wire comprises one of FeCrAl, or an alloy selected from the Inconel X-750 series. A first protective layer covering the at least one high-strength alloy wire comprises a protective oxide layer formed by pre-oxidizing and heat treating the high-strength alloy wire and a second protective layer covering the at least one high-strength alloy wires comprises a 20 micrometer oxide coating.

In another embodiment the high-strength Superconducting cable further comprises a 1+6 cable pack, a 4+3 cable pack, a 3+4 cable pack, a cable-in-conduit cable, and a Rutherford cable. The heat treatment cycle is preformed in 100% flowing O2 that reaches a temperature of at least 891 degrees Celsius.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art, which are also intended to be encompassed by the following claims.

What is claimed is:

1. A method comprising:
   forming at least two protective layers around at least one high-strength alloy wire, said high strength alloy wire comprising a plurality of filaments embedded in an Ag matrix, wherein a first protective layer is an $Al_2O_3$ passivation oxide layer and a second protective layer is a $TiO_2$ non-reactive oxide layer;
   coating at least one Superconducting wire with a protective layer;
   arranging said at least one high-strength alloy wire and said at least one Superconducting wire to form a high-strength Superconducting cable; and
   treating said Superconducting cable with a heat treatment cycle.

2. The method of claim 1 wherein said at least one Superconducting wire comprises Bi-2212 round wire.

3. The method of claim 2 wherein said at least one high-strength alloy wire comprises FeCrAl.

4. The method of claim 3 wherein forming at least two protective layers around at least one high strength alloy wire further comprises:
   pre-oxidizing and heat treating said high-strength alloy wire to form said first protective layer; and
   coating said at least one high-strength alloy wire with 10 micrometer oxide to form said second protective layer.

5. The method of claim 1 wherein arranging said at least one high-strength alloy wire and said at least one Superconducting wire to form said high-strength Superconducting cable further comprises:
   wrapping said at least one high-strength alloy wire and said at least one Superconducting wire into one of:
   a 4+3 cable pack;
   a 3+4 cable pack;
   a cable-in-conduit cable; and
   a Rutherford cable.

6. The method of claim 5 wherein arranging said at least one high-strength alloy wire and said at least one Superconducting wire to form said high-strength Superconducting cable further comprises:
   winding said Superconducting cable into a coil.

7. The method of claim 1 wherein treating said high-strength Superconducting cable with a heat treatment cycle further comprises;
   raising a temperature to 820 degrees Celsius in 100% flowing O2 for two hours; and
   raising said temperature from 820 degrees Celsius to a temperature of at least 891 degrees Celsius for 0.2 hours.

\* \* \* \* \*